United States Patent
Uchiyama (12) 
(10) Patent No.: US 6,542,213 B1
(45) Date of Patent: Apr. 1, 2003

(54) COMPRESSION-BOND-CONNECTION SUBSTRATE, LIQUID CRYSTAL DEVICE, AND ELECTRONIC EQUIPMENT

(75) Inventor: Kenji Uchiyama, Hotaka-machi (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 09/445,010
(22) PCT Filed: Apr. 6, 1999
(86) PCT No.: PCT/JP99/01831
§ 371 (c)(1), (2), (4) Date: Nov. 30, 1999
(87) PCT Pub. No.: WO99/53735
PCT Pub. Date: Oct. 21, 1999

(30) Foreign Application Priority Data

Apr. 9, 1998 (JP) ............................................. 10-098008

(51) Int. Cl.$^7$ ............................................. G02F 1/1345
(52) U.S. Cl. ....................................................... 349/149
(58) Field of Search ................................. 349/149–152, 349/158; 174/52.1, 52.4, 174, 176, 255, 259; 257/666, 678, 734, 736, 773, 776, 781, 785

(56) References Cited

U.S. PATENT DOCUMENTS 6,128,063 A * 10/2000 Uchiyama et al. .......... 349/150

FOREIGN PATENT DOCUMENTS

| JP | 53-51469 | 5/1978 |
|---|---|---|
| JP | 63-37081 | 3/1988 |
| JP | 63-184781 | 7/1988 |
| JP | 63-184784 | 7/1988 |
| JP | 5-183247 | 7/1993 |
| JP | 6-244545 | 9/1994 |
| JP | 7-66240 | 3/1995 |
| JP | 09-186192 | 7/1997 |

OTHER PUBLICATIONS

McGraw–Hill Electronics Dictionary—5$^{th}$ ed.—1994—p. 534.*

* cited by examiner

Primary Examiner—Toan Ton
Assistant Examiner—Timothy L. Rude
(74) Attorney, Agent, or Firm—Harness, Dickey & Pierce, P.L.C.

(57) ABSTRACT

A compression-bond-connection substrate compression-bonded to a compression-bonding target object has front-side terminals conductively connected to opposing-side terminals and backside terminals formed at the backsides thereof. The backside terminals are formed diagonally to the front-side terminals. Pressure is exerted uniformly on substrate-side terminals in the pressure application in compression-bonding. Therefore, a highly reliable compression-bonding connected assembly can be stably obtained.

5 Claims, 7 Drawing Sheets

Fig. 10  Prior Art

COMPRESSION-BOND-CONNECTION SUBSTRATE, LIQUID CRYSTAL DEVICE, AND ELECTRONIC EQUIPMENT

TECHNICAL FIELD

The present invention relates to a compression-bond-connection substrate to be connected to other members by compression-bonding method. The invention also relates to a liquid crystal device comprised of the compression-bond-connection substrate. Also, the invention relates to an electronic equipment comprised of the liquid crystal device.

BACKGROUND ART

Currently, liquid crystal devices are being widely used in various types of electronic equipment, such as portable telephones and portable information terminals. In most of these devices, liquid crystal devices are used to display visual information including characters, numbers, and graphical patterns.

The liquid crystal devices are generally comprised of substrates opposing each other and a liquid crystal sealed between the substrates. In the liquid crystal devices, there is a case in which a compression-bond-connection substrate is connected to either one or both of the substrates. The compression-bond-connection substrate has a drive circuit for driving the liquid crystal device. In the drive circuit, elements including IC chips and passive-element chip parts are mounted, and wiring patterns required to connect the abovementioned elements are formed. Also, substrate-side terminals to be conductively connected to terminals on the side of the liquid crystal device are formed at appropriate locations on the compression-bond-connection substrate.

Compression-bonding processing conductively connects substrate-side terminals formed on the compression-bond-connection substrate to terminals formed on the substrates of the liquid crystal device (that is, opposing-side terminals). The compression-bonding processing uses an anisotropic conductive adhesive, such as an ACF (anisotropic conductive film), an ACP (anisotropic conductive paste), or an ACA (anisotropic conductive adhesive). The processing is performed in such a manner that the anisotropic conductive adhesive is sandwiched between the substrate of the liquid crystal device and the compression-bond-connection substrate, and the adhesive is then heated and pressed by using a compression-bonding tool.

As compression-bond-connection substrates, a single-sided wired type, a double-sided wired type, and a multilayer wired type can be considered. The single-sided wired type is a wiring type in which all elements, such as the drive circuit, wiring patterns, and substrate-side terminals are formed on a single side of the substrate. The double-sided wired type is a wiring type in which elements such as the drive circuit, wiring patterns, and substrate-side terminals are arranged on both sides of the substrate, and they become conductive through conductive throughholes as required. The multilayer wired type is a wiring type in which a wiring layer is repeatedly layered with an insulating layer therebetween, and individual wiring layers become conductive through conductive throughholes as required.

Figure 10:
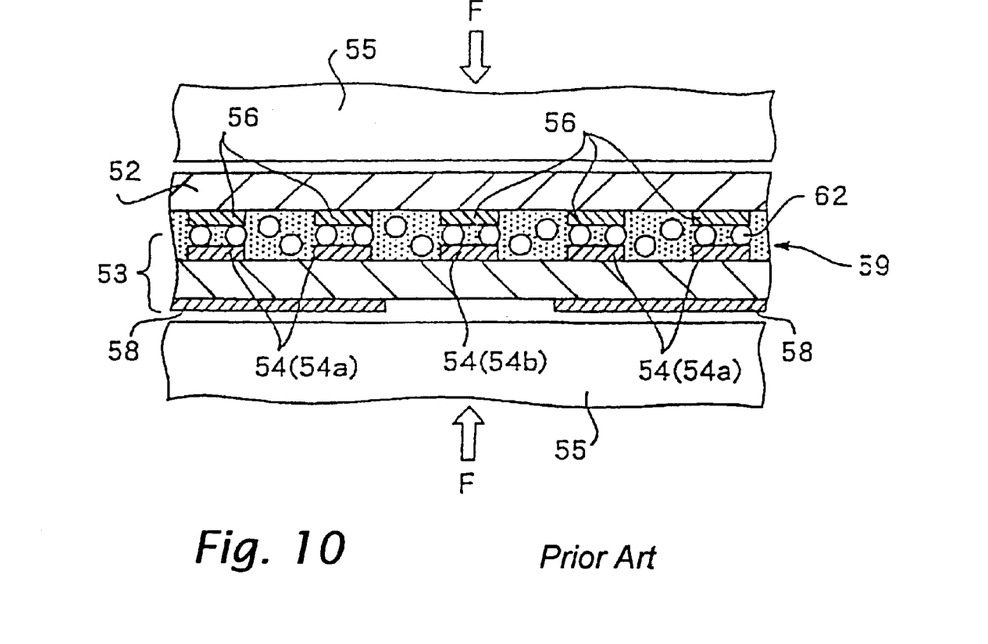
FIG. 10 is a cross-sectional view showing a state in which the conventional compression-bond-connection substrate is connected to a compression-bonding target object.

FIG. 10 shows a state in which an ACF 59 is used to connect a compression-bond-connection substrate 53 of the double-sided wired type to a compression-bonding target object 52 by compression-bonding. In the state shown, a compression-bonding tool 55 heats the ACF 59 arranged between the compression-bonding target object 52 and the compression-bond-connection substrate 53 at a predetermined temperature and concurrently presses it with a pressure F. The ACF 59 is then caused to harden, resulting in compression-bonding of the compression-bonding target object 52 and the compression-bond-connection substrate 53. By compression-bonding, a plurality of front-side terminals 54 (substrate-side terminals) formed on the compression-bond-connection substrate 53 are individually electrically conductively connected to opposing-side terminals 56 of the compression-bonding target object 52 via conductive balls 62 in the ACF 59.

Figure 9:
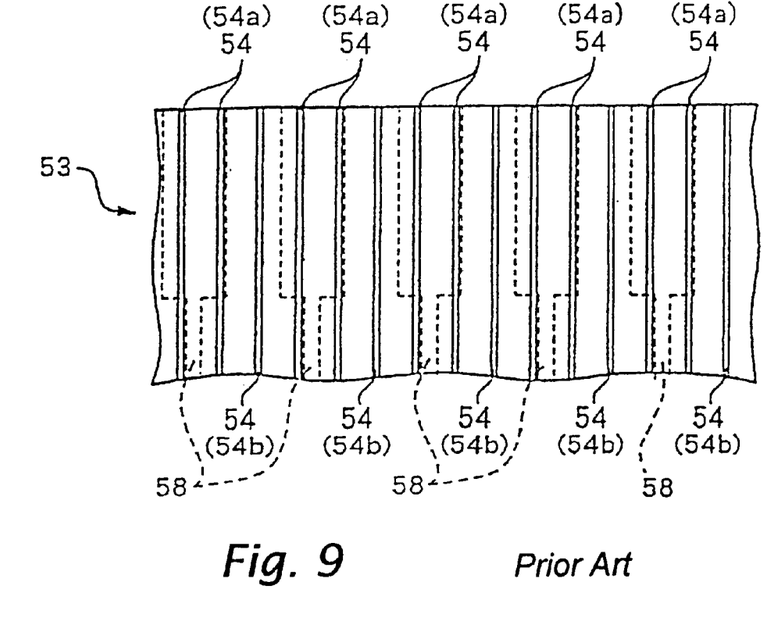
FIG. 9 is a plan view showing major portions of a conventional compression-bond-connection substrate.

In the case of the aforementioned conventional compression-bond-connection substrate 53 of the double-sided wired type, however, while the front-side terminals 54 are formed on the compression-bonding side surface, backside terminals 58 are formed on the reverse side of the compression-bonding-side surface. Conventionally, as shown in FIG. 9, the backside terminals 58 are formed parallel to the front-side terminals 54. Also, for example, when the backside terminals 58 are used as an elastic connector such as a rubber connector, the pitch thereof is larger than that of the front-side terminals 54. Therefore, the plurality of front-side terminals 54 includes both types of front-side terminals 54a overlapping with the backside terminals 58 and front-side terminals 54b not overlapping with the backside terminals 58.

In the case of the compression-bond-connection substrate 53 as described above, when compression-bonding is carried out by using the compression-bonding tool 55, a high pressure is exerted on the front-side terminals 54a overlapping with the backside terminals 58 whereas an insufficient pressure is exerted on the front-side terminals 54b not overlapping with the backside terminals 58. This causes the connection between the plurality of opposing-side terminals 56 and the plurality of front-side terminals 54 to be partially insufficient, significantly reducing the reliability of the connection therebetween.

A connection assembly as shown in FIG. 10 uses the compression-bond-connection substrate 53 of the double-sided wired type having a configuration in which the wiring layers are formed on both the front side and the backside of the substrate. Nevertheless, a problem similar to the above arises even in a compression-bond-connection substrate of the multilayer wired type having a configuration in which multiple wiring layers are overlaid.

The present invention is to provide a compression-bond-connection substrate such as that of a double-sided wired type or multilayer wired type that has a configuration in which multiple wiring layers are overlaid and terminals are formed overlappingly in identical regions of both the front surface and the backside surface, which allows stable provision of a highly reliable compression-bonding connected assembly.

DISCLOSURE OF INVENTION

The present invention provides a compression-bond-connection substrate to be connected by compression-bonding to a compression-bonding target object provided with opposing-side terminals, including front-side terminals conductively connected to the opposing-side terminals and backside terminals formed at the backsides of the front-side terminals, characterized in that the backside terminals are arranged so as to cross with the front-side terminals.

Figure 3:
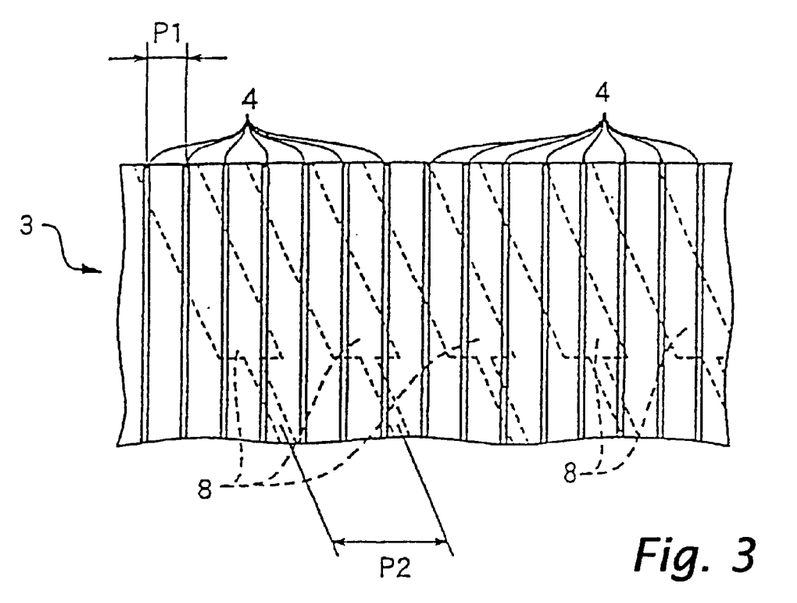
FIG. 3 is a plan view of major portions of the compression-bond-connection substrate according to the present invention.

In such a present invention as above, as shown in FIG. 3 for example, backside terminals 8 formed on the backside of a compression-bond-connection substrate 3 are arranged so as to cross with front-side terminals 4 formed on a compression-bonding-side surface of the substrate 3. As a result, as is apparent in FIG. 3, even when pitch P2 of the backside terminals 8 is larger than pitch P1 of the front-side terminals 4, a portion of the backside terminals 8 is ensured to exist at the backsides of all the front-side terminals 4.

Figure 4:
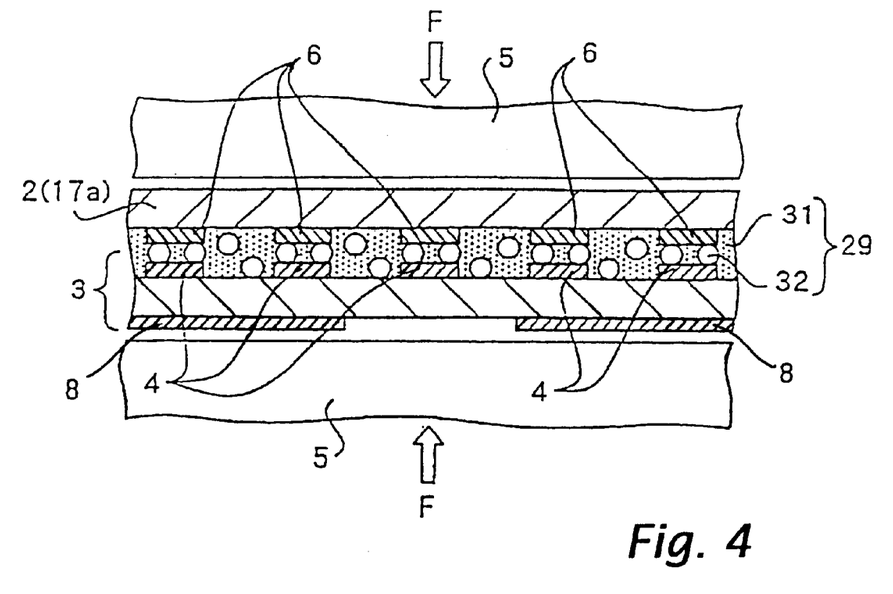
FIG. 4 is a cross-sectional view showing a state in which the compression-bond-connection substrate of the present invention is connected to a compression-bonding target object.

Because of the above, as shown in FIG. 4, in compression-bonding of the compression-bond-connection substrate 3 to a compression-bonding target object 2 by use of a compression-bonding tool 5, the pressure is applied uniformly by the compression-bonding tool 5 to each individual front-side terminals 4. As a result, all the individual front-side terminals 4 can be ensured to be conductively connected to all of individual opposing-side terminals 6. That is, according to the compression-bond-connection substrate of the present invention, even in the case of a substrate on which a plurality of wiring patterns is overlaid, as in a double-sided wired type or a multilayer wired type, a highly reliable compression-bonded assembly can be obtained.

Also, in the compression-bond-connection substrate having the above configuration, the backside terminals may be arranged diagonally to the front-side terminals. In this case also, the same effects as those described above can be obtained.

Also, in the compression-bond-connection substrate having the above configuration, the front-side terminals may be conductively connected to transmissive electrodes formed at least on one of a pair of substrates of a liquid crystal panel which includes the pair of substrates opposing each other and a liquid crystal sealed between the substrates.

Figure 5:
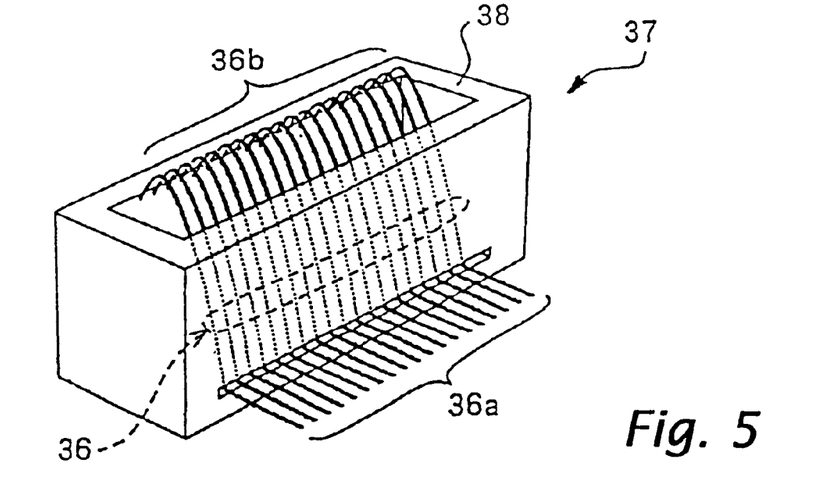
FIG. 5 is a perspective view of an example of an elastic connector.
Figure 6:
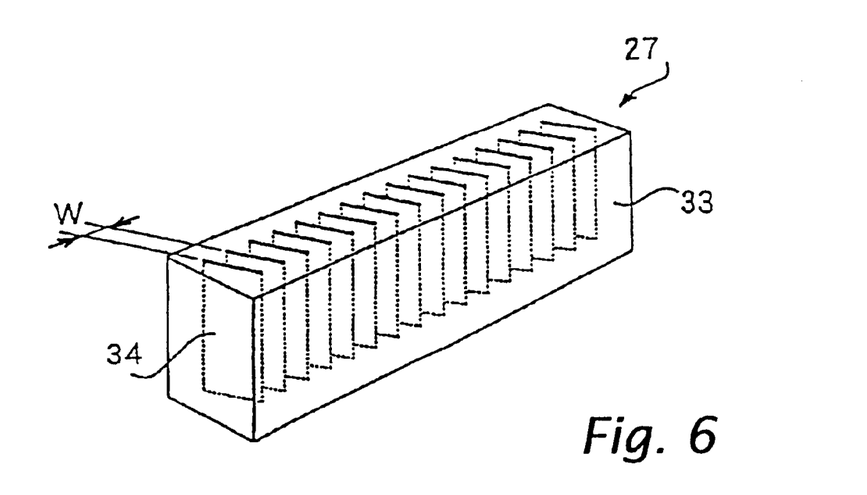
FIG. 6 is a perspective view of another example of an elastic connector.

Also, in the compression-bond-connection substrate having the above configuration, the backside terminals may be conductively connected to an elastic connector. The "elastic connector" has a base including terminal materials themselves or terminal materials, which is formed of an elastic material such as a metal spring or rubber, and has a construction in which a residual force of the elastic material serves so as to connect the terminals. Examples that may be used are a rubber connector as shown in FIG. 5 and a spring connector as shown in FIG. 6.

Also, the compression-bond-connection substrate having the above configuration may be conductively connected to the opposing-side terminals via an anisotropic conductive film.

In the present invention as described above, as shown in FIG. 4 for example, an anisotropic conductive film (ACF) 29 as an adhesive material is sandwiched between the compression-bond-connection substrate 3 and the compression-bonding target object 2. Furthermore, the ACF 29 is heated, and concurrently, the compression-bond-connection substrate 3 and the compression-bonding target object 2 are pressed together with a force F. At this time, the front-side terminals 4 of the compression-bond-connection substrate 3 are ensured to conductively connect to the opposing-side terminals 6 of the compression-bonding target object 2. This allows a highly reliable compression-bonded assembly to be produced.

Also, the present invention provides a liquid crystal device including a pair of substrates opposing each other, a liquid crystal sealed between the substrates, and a compression-bond-connection substrate compression- connected to at least one of the substrates, characterized in that the compression-bond-connection substrate is as described above.

According to the liquid crystal device, even in the case of a substrate on which a plurality of wiring patterns overlap with each other, as in a double-sided wired type or a multilayer wired type, a highly reliable compression-bonded assembly can be obtained. Therefore, occurrence of display defects due to failed electrical conductivity can be avoided.

Also, the present invention provides an electronic equipment comprised of a liquid crystal device, characterized in that the liquid crystal device is as described above, allowing provision of an electronic equipment in which effects similar to the above can be obtained. As electronic equipments of this type, devices such as portable telephones and portable information terminals can be considered.

BEST MODE FOR CARRYING OUT THE INVENTION

Embodiments of the present invention are described below with reference to the drawings.

First Embodiment

Figure 1:
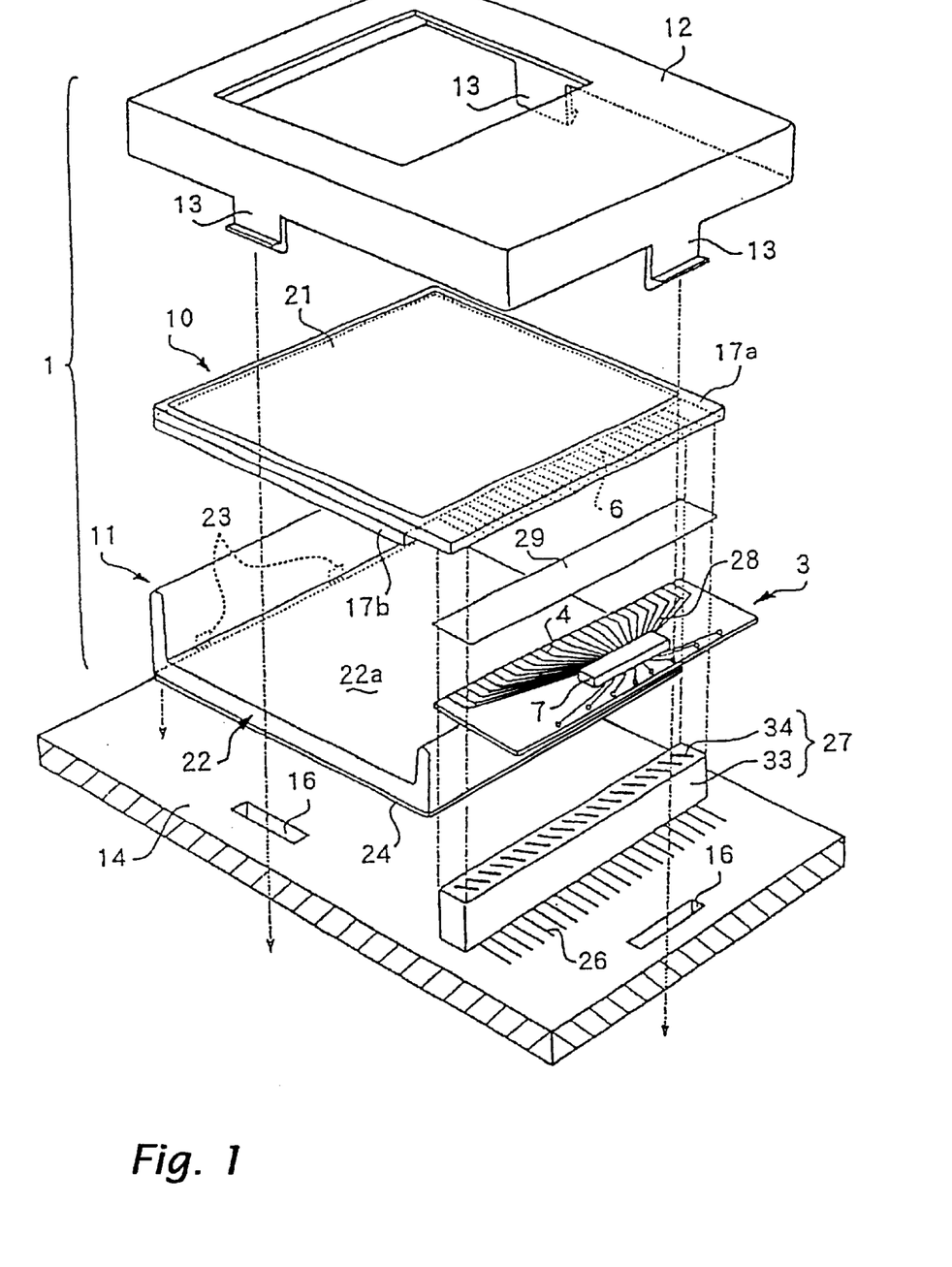
FIG. 1 is an exploded perspective view showing major portions of an embodiment of a compression-bond-connection substrate according to the present invention, an embodiment of a liquid crystal device including the above-mentioned embodiment, and an embodiment of an electronic equipment including the abovementioned embodiments.

FIG. 1 shows an embodiment of a compression-bond-connection substrate according to the present invention and shows an embodiment of a liquid crystal device according to the present invention which is composed by use of the aforementioned substrate. Also, FIG. 1 partially shows an electronic equipment according to the present invention.

Figure 2:
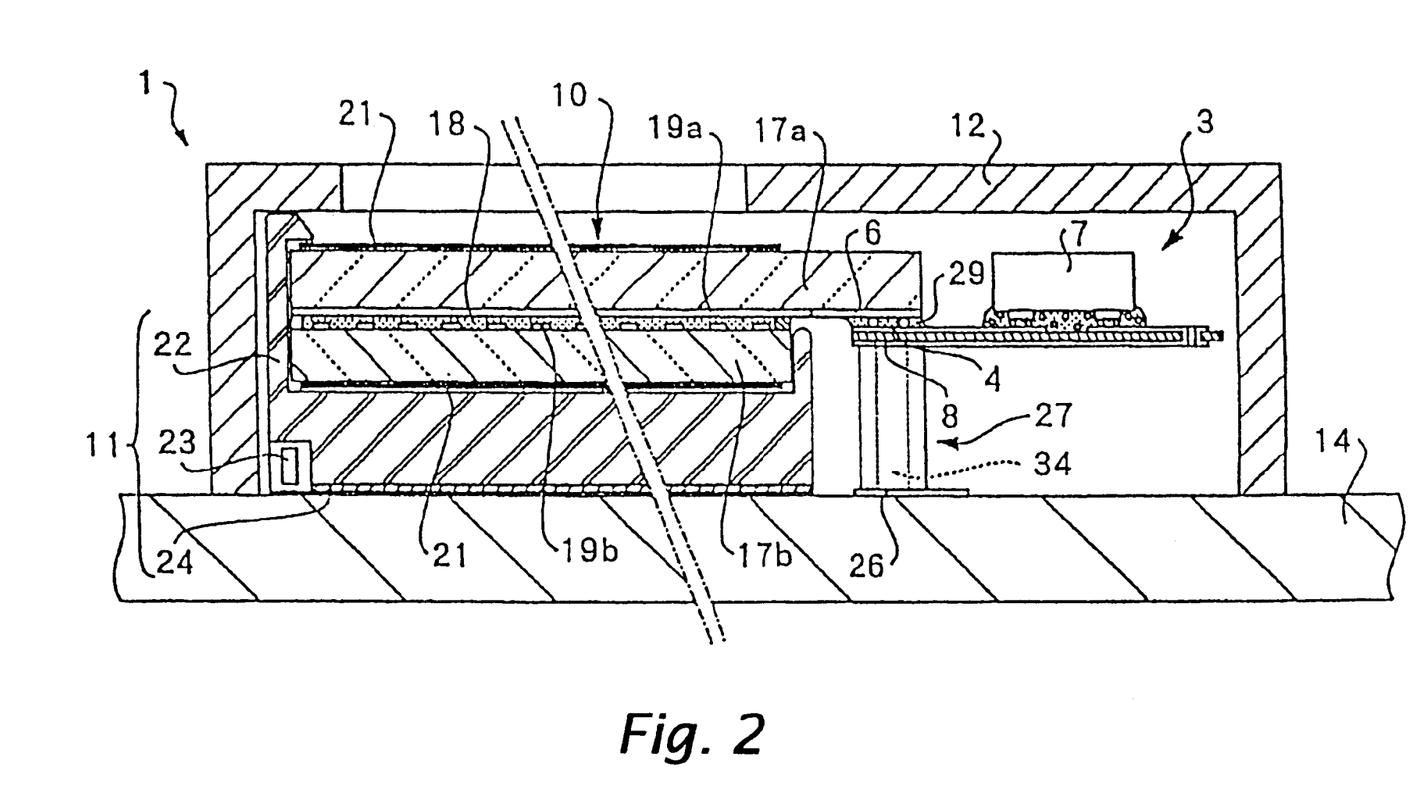
FIG. 2 is a cross-sectional view of the individual embodiments shown in FIG. 1.

A liquid crystal device 1 shown therein is composed in a manner that a compression-bond-connection substrate 3 and a backlight unit 11 are mounted on a liquid crystal panel 10, and furthermore, they are housed in a housing 12. The housing 12 has engaging tabs 13 at lower sidewall portions of the housing 12. The engaging tabs 13 are engaged into engaging holes 16 made on a frame substrate 14 of the electronic equipment. In this way, as shown in FIG. 2, the liquid crystal panel 10 and the backlight unit 11 are set in a predetermined position of the frame substrate 14.

The liquid crystal panel 10 is comprised of a pair of transmissive substrates 17a and 17b opposing each other and a liquid crystal 18 sealed into a small gap, that is a cell-gap. The transmissive substrates 17a and 17b are formed of materials such as glass and plastics. Also, the transmissive substrates 17a and 17b have respective transmissive electrodes 19a and 19b formed on their inner surfaces. In the drawing, the end (the right in the drawing) of the transmissive electrode 19a positioned at an upper side is constituted of opposing-side terminals 6. The transmissive electrode 19b at the lower side in the drawing is conductively connected to the opposing-side terminal 6 via a conductive material (not shown) arranged between the transmissive substrate 17a and the transmissive substrate 17b.

Also, on the respective transmissive electrodes 19a and 19b, alignment layers (not shown) are formed, and an alignment layer treatment such as a rubbing treatment is applied to the alignment layers. Also, polarizers 21 are adhered to outer surfaces of the respective transmissive substrates 17a and 17b.

Referring back to FIG. 1, the backlight unit 11 is comprised of a light guide 22 made of a material such as a polycarbonate or an acrylic, a plurality of LEDs (light-emitting diodes) 23 arranged at one end of the light guide 22, and a light-reflector 24 adhered on the reverse-side surface of a light-emitting face 22a of the light guide 22. On a surface of the frame substrate 14 composing an electronic equipment such as a portable telephone, there are arranged equipment-side terminals 26 extending from a host control unit on the side of the electronic equipment.

An implementing assembly for electrically connecting the liquid crystal device 1 and the frame substrate 14 of the electronic equipment is comprised of the compression-bond-connection substrate 3 having a liquid-crystal driving IC 7, and a rubber connector 27 as an elastic connector. The compression-bond-connection substrate 3 is comprised, for example, of a COB (chip on board) which includes an IC chip mounted on a hard circuit substrate thereof, and a COF (chip on flexible printed circuit) which includes an IC chip mounted on an FPC (flexible printed circuit) thereof.

The compression-bond-connection substrate 3 has wiring patterns 28 formed by a known pattern-forming process on a compression-bonding-side surface (the upper surface in the drawings) thereof, and particularly, has front-side terminals 4 on an end-side portion thereof. The front-side terminals 4 are conductively connected to the opposing-side terminals 6 formed on a surface of an extended portion of the transmissive substrate 17a constituting the liquid crystal panel 10.

As shown in FIG. 3 with dotted lines, back-side-face terminals 8 (backside terminals) are formed on the reverse-side surface (the lower-side surface in the drawing) of the compression-bonding-side surface of the compression-bond-connection substrate 3. These back-side-face terminals 8 are conductively connected to the rubber connector 27 (refer to FIG. 1). The width of the back-side-face terminals 8 is determined to be larger than that of the front-side terminals 4, and a pitch P2 thereof is also determined to be larger than a pitch P1 of the front-side terminals 4.

The back-side-face terminals 8 used in this embodiment are diagonally arranged so as to cross with the plurality of front-side terminals 4. In this diagonal arrangement, a portion of the back-side-face terminals 8 overlaps with the individual backsides of the front-side terminals 4.

The compression-bond-connection substrate 3 shown in FIG. 1 is connected to the transmissive substrate 17a of the liquid crystal panel 10 as a compression-bonding target object in the following manner. The connecting material such as the ACF (anisotropic conductive film) 29 is sandwiched between the transmissive substrate 17a of the liquid crystal panel 10 and the compression-bond-connection substrate 3, the liquid crystal panel 10 being a compression-bonding target object. The ACF is pre-adhered to its opposing portion of the transmissive substrate 17a, the opposing portion extending outwardly from the transmissive substrate 17b, that is, a portion where the opposing-side terminals 6 are formed. Then, an end-side portion of the compression-bond-connection substrate 3 where the front-side terminals 4 are formed is overlapped with the ACF 29. Consecutively, as shown in FIG. 4, the ACF 29 is heated using the compression-bonding tool 5 heated with a predetermined temperature, and concurrently, the transmissive substrate 17a and the compression-bond-connection substrate 3 are pressed together from the outside with a pressure F so as to press the ACF 29.

As a result of the above heating and pressing processing, that is, compression-bonding processing, the transmissive substrate 17a and the compression-bond-connection substrate 3 are adhered together by adhesive portions 31 of the ACF 29. Also, the front-side terminals 4 on the side of the compression-bond-connection substrate 3 and the opposing-side terminals 6 on the side of the transmissive substrate 17a are conductively connected by a conductive balls 32 of the ACF 29.

As shown in FIG. 3, in the present invention, the backside-face terminals 8 of the compression-bond-connection substrate 3 are diagonally arranged so as to cross with the front-side terminals 4, by which a portion of the back-side-face terminals 8 overlaps with the individual backsides of the front-side terminals 4. Therefore, as shown in FIG. 4, in compression-bonding processing with the compression-bonding tool 5, the individual front-side terminals 4 are uniformly applied with the pressure F via the back-side-face terminals 8. This allows uniform distribution of the pressure application among the plurality of front-side terminals 4, resulting in complete conductive connection of all the front-side terminals 4 to the opposing-side terminals 6. This allows the manufacture of a compression-bonded connected assembly having high connection reliability.

Referring to FIG. 1, the liquid crystal panel 10 connected to the compression-bond-connection substrate 3 is mounted on the light guide 22. Also, the rubber connector 27 is placed in a position corresponding to the back-side-face terminals 8 (refer to FIG. 3) of the compression-bond-connection substrate 3, and also, the housing 12 is fitted to the frame substrate 14 of the electronic equipment. As a result, the back-side-face terminals 8 of the compression-bond-connection substrate 3 are conductively connected to the equipment-side terminals 26 of the frame substrate 14 via the rubber connector 27. The rubber connector 27 can either be arranged independently on the frame substrate 14 or be supported using the light guide 22 of the backlight unit 11.

As shown in FIG. 5, the rubber connector 27 includes an elastic base 33 and many electrical conductors 34. The elastic base 33 is formed of an electrically-insulating material such as a silicon rubber and substantially in a rectangular-parallelepiped-shape. The electrical conductors 34 are arranged parallel to each other in the elastic base 33. Each of the electrical conductors 34 has two ends exposed outwardly from the elastic base 33. Also, the area between two adjacent electrical conductors 34 is caused to be a non-electrically-conductive area due to the elastic material. The distance between the individual electrical conductors, that is, a pitch W between the electrical conductors, is maintained in a range, for example, from 30 $\mu$m to 50 $\mu$m.

Referring to FIG. 2, the plurality of back-side-face terminals 8 formed on an edge portion of the compression-bond-connection substrate 3 are individually conductively connected to the plurality of equipment-side terminals 26 formed on the frame substrate 14 via the individual electrical conductors 34 in the rubber connector 27. The rubber connector 27 is pushed by the housing 12 so as to elastically change to appropriate shapes, and a residience force at this time serves to conductively connect the terminals.

FIG. 6 shows a spring connector as a modification of the elastic connector. This spring connector 37 may be used instead of the rubber connector 27 shown in FIG. 5. The spring connector 37 as shown is comprised of a plurality of spring terminals 36 arranged parallel to each other and a housing 38 for housing the spring terminals 36. The individual spring terminals 36 have fixed terminals 36a extending outwardly from a side surface of the housing 38, and have mobile terminals 36b extending outwardly from an upper surface of the housing 38. The mobile terminals 36b have spring characteristics possessed by the spring terminal 36 so as to move upward and downward as viewed in the drawing.

The spring connector 37 is attached to the frame substrate 14 (see FIG. 1) in such a manner that the fixed terminals 36a are conductively connected by soldering or the like to the equipment-side terminals 26. Consecutively, the backlight unit 11 and the liquid crystal panel 10 are mounted on the frame substrate 14 to which the spring connector 37 is attached. Also, the housing 12 is fitted to the frame substrate 14. In this arrangement, the back-side-face terminals 8 (refer to FIG. 3) of the compression-bond-connection substrate 3 that is integral with the liquid crystal panel 10 are caused to self-contact the mobile terminals 36b of the spring connector 37, pushing them downward. The mobile terminals 36b have spring characteristics possessed by the spring terminals 36 so as to push the back-side-face terminals 8 according to the spring characteristics. This allows the stable and complete conductive connection to be obtained between the mobile terminals 36b and the back-side-face terminals 8.

Second Embodiment

Figure 7:
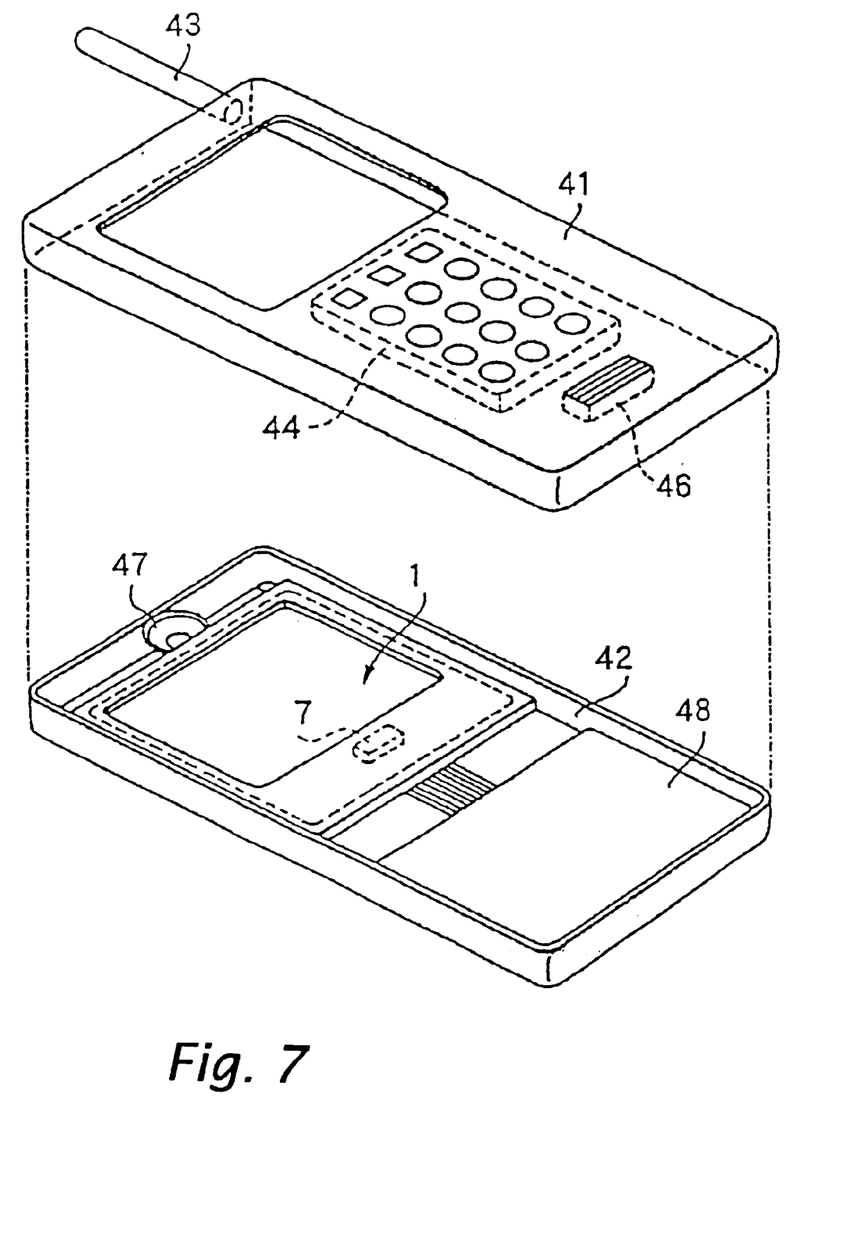
FIG. 7 is an exploded perspective view of an embodiment of an electric equipment according to the present invention.

FIG. 7 shows an electronic equipment of an embodiment according to the present invention. In this embodiment, a liquid crystal device of the present invention is applied to a portable telephone as an electronic equipment. The portable telephone shown in the figure is comprised of an upper housing 41 and a lower housing 42. The upper housing 41 includes a transmitting/receiving antenna 43, a keyboard unit 44, and a microphone 46. The lower housing 42 includes a liquid crystal device 1 as shown, for example, in FIG. 1, a speaker 47, and a circuit board 48.

Figure 8:
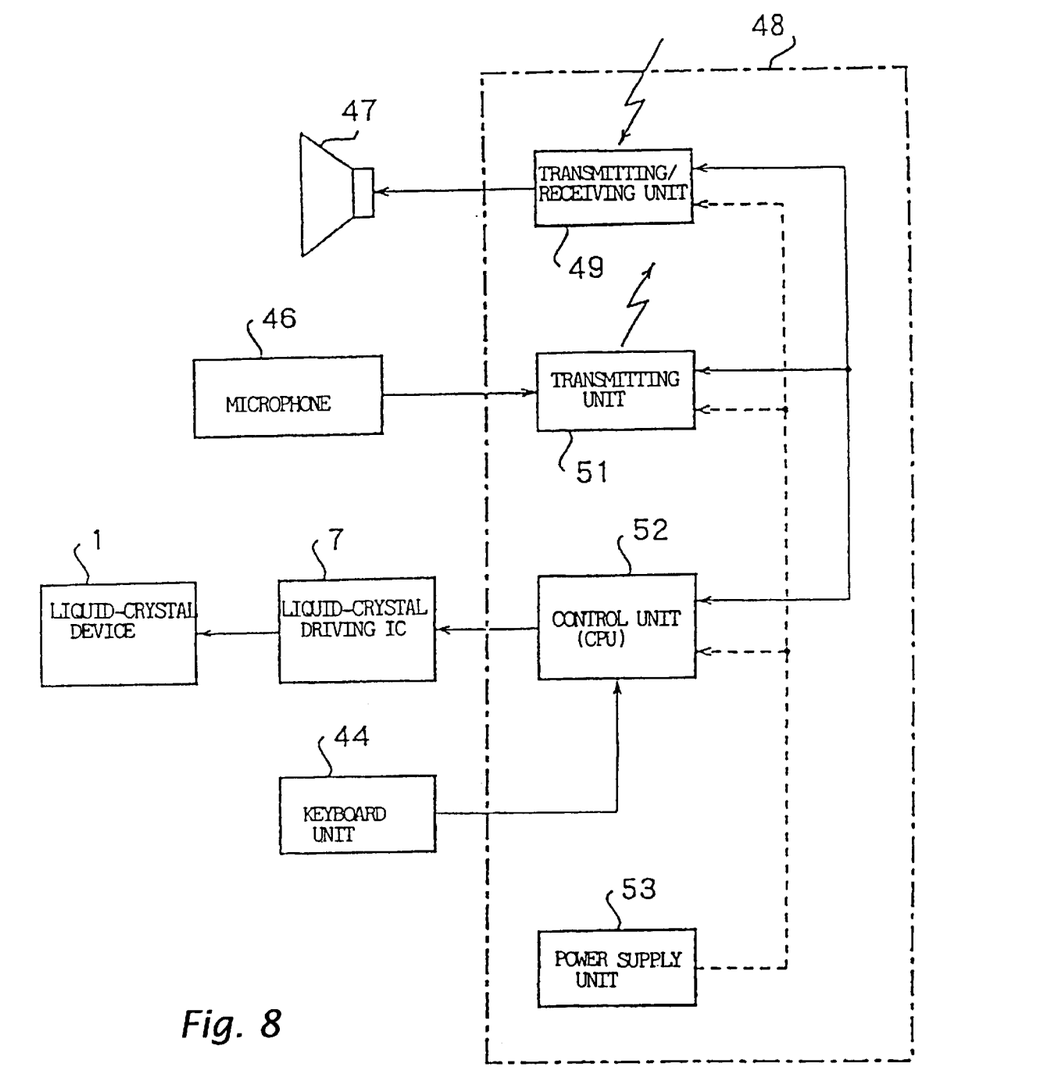
FIG. 8 is a block diagram showing an example of an electric control system used in the electronic equipment in FIG. 7.

As shown in FIG. 8, on the circuit board 48, there are arranged a receiving unit 49 connected to an input terminal of the speaker 47, a transmitting unit 51 connected to an output terminal of the microphone 46, a control unit 52 comprised of a CPU, and a power supply unit 53 for supplying power to the individual units. The control unit 52 reads a status in the transmitting unit 51 and receiving unit 49, and based on the result, feeds information to a liquid-crystal driving IC 7 so that visual information such as characters and numbers are displayed in a display region of the liquid crystal device 1. Also, based on information output from the keyboard unit 44, the control unit 52 feeds information to the liquid-crystal driving IC 7 so that the visual information is displayed in the display region of the liquid crystal device 1.

Other Embodiments

The present invention has been described with reference to the preferred embodiments, however, the invention is not restricted to the embodiments, and it may be modified in various ways within the scope of the invention.

For example, in the compression-bond-connection substrate 3 shown in FIG. 1, the compression-bond-connection substrate of the double-sided wired type is described. However, the present invention may of course be applied to a substrate of the multilayer wired type on which three or more wiring layers are overlaid. Also, as the liquid crystal panel 10 shown in FIG. 1, either a passive matrix liquid crystal panel or an active matrix liquid crystal panel may be applied.

What is claimed is:

1. A compression-bond-connection assembly comprising:

a substrate having a first side and a second side, said first side being opposite said second side;

a first plurality of terminals formed on said first side of said substrate;

a second plurality of terminals formed on said second side of said substrate, said second plurality of terminals being generally arranged so as to cross and overlap with said first plurality of terminals; and a target object having a third plurality of terminals, said third plurality of terminals being conductively connected to and adjacent said first plurality of terminals generally in a stacked relationship;

wherein conductive connected portions compressively bonded together are formed above overlapping regions; and wherein said second plurality of terminals is conductively connected to an elastic connector.

2. The compression-bond-connection assembly as stated in claim 1 wherein said first plurality of terminals is conductively connected to transmissive electrodes formed at least on one of a pair of liquid crystal substrates of a liquid crystal panel, said liquid crystal panel having said pair of liquid crystal substrates opposing each other and a liquid crystal sealed between said pair of liquid crystal substrates.

3. The compression-bond-connection assembly as stated in claim 1 wherein said first plurality of terminals is conductively connected to said third plurality of terminals via an anisotropic conductive film.

4. A liquid crystal device comprising:

a target object;

a plurality of terminals formed on said target object;

a substrate opposite said target object, said substrate having first and second sides;

a plurality of terminals formed on said first side of said substrate opposite said terminals formed on said target object;

an adhesive material disposed between said target object and said substrate; and a plurality of external terminals formed on said second side of said substrate and at a diagonal so as to cross and overlap with said terminals formed on said first side of said substrate such that said plurality of terminals formed on said target object is in a stacked relationship with said plurality of terminals formed on said first side of said substrate and said plurality of external terminals formed on said second side of said substrate to facilitate compression-bonding thereof;

wherein a conductive connecting structure is formed within the adhesive material above overlapping terminal regions; and wherein said plurality of external terminals formed on said second side of said substrate are conductively connected to an elastic connector.

5. The liquid crystal device of claim 4 wherein said adhesive material is an anisotropic conductive film.

* * * * *